(12) United States Patent
Hirao et al.

(10) Patent No.: US 8,236,671 B2
(45) Date of Patent: Aug. 7, 2012

(54) METHOD OF MANUFACTURING SEMICONDUCTOR DEVICE

(75) Inventors: Naoki Hirao, Kanagawa (JP); Yuya Miura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/053,416

(22) Filed: Mar. 22, 2011

(65) Prior Publication Data

US 2011/0244667 A1 Oct. 6, 2011

(30) Foreign Application Priority Data

Mar. 30, 2010 (JP) ................................. 2010-079571

(51) Int. Cl.
*H01L 21/20* (2006.01)
(52) U.S. Cl. ................................ 438/479; 257/E21.121
(58) Field of Classification Search .................. None
See application file for complete search history.

(56) References Cited

U.S. PATENT DOCUMENTS 7,164,158 B2 1/2007 Stein et al.
2008/0150085 A1* 6/2008 Dadgar et al. ............... 257/615

FOREIGN PATENT DOCUMENTS

JP 2006-086388 A 3/2006

* cited by examiner

*Primary Examiner* — Seahvosh Nikmanesh
(74) *Attorney, Agent, or Firm* — Wolf, Greenfield & Sacks, P.C.

(57) ABSTRACT

A method of manufacturing a semiconductor device including a nitride semiconductor layer having high-precision thickness is provided. The method includes steps of: forming a gallium nitride (GaN) layer whose main face is a +c face on a substrate; forming a trench by selectively etching down a partial region in the +c face of the GaN layer; forming a metal layer so as to bury the trench; and separating the substrate and the GaN layer, after that, polishing a −c face of the GaN layer until the metal layer is exposed, and removing a part in a thickness direction of the GaN layer.

6 Claims, 9 Drawing Sheets

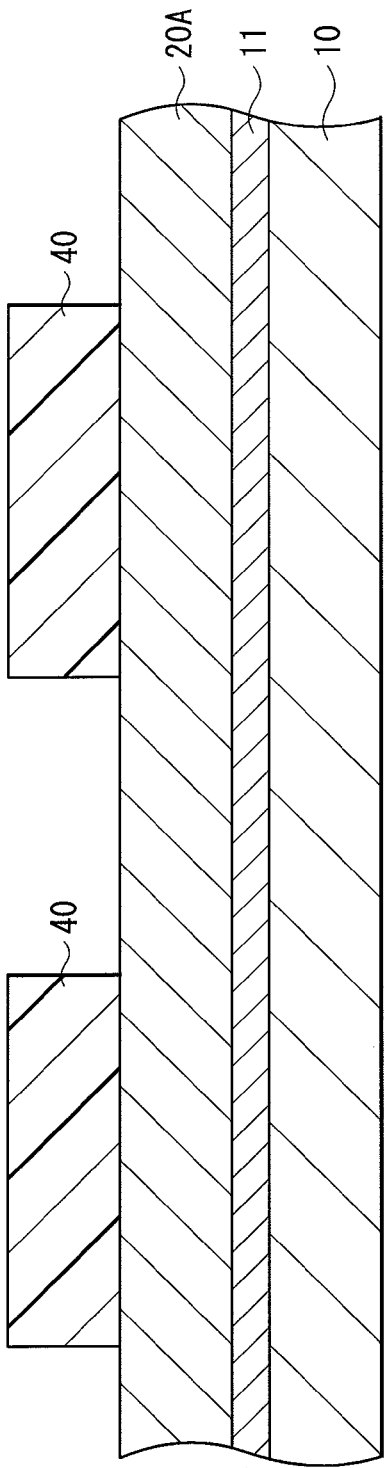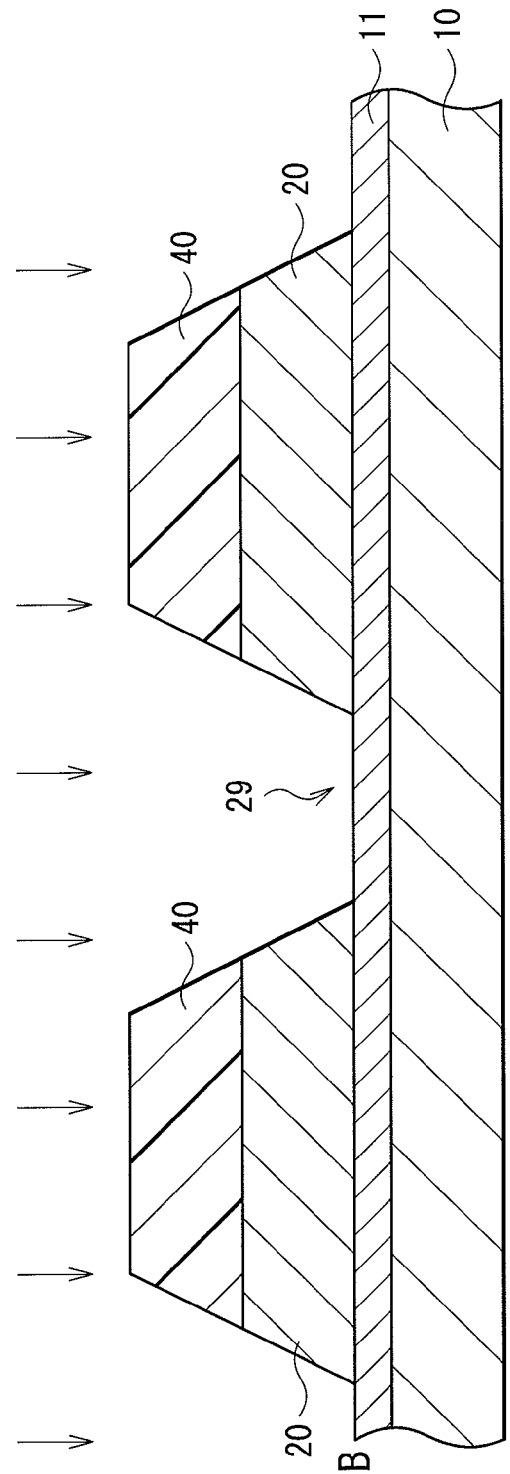

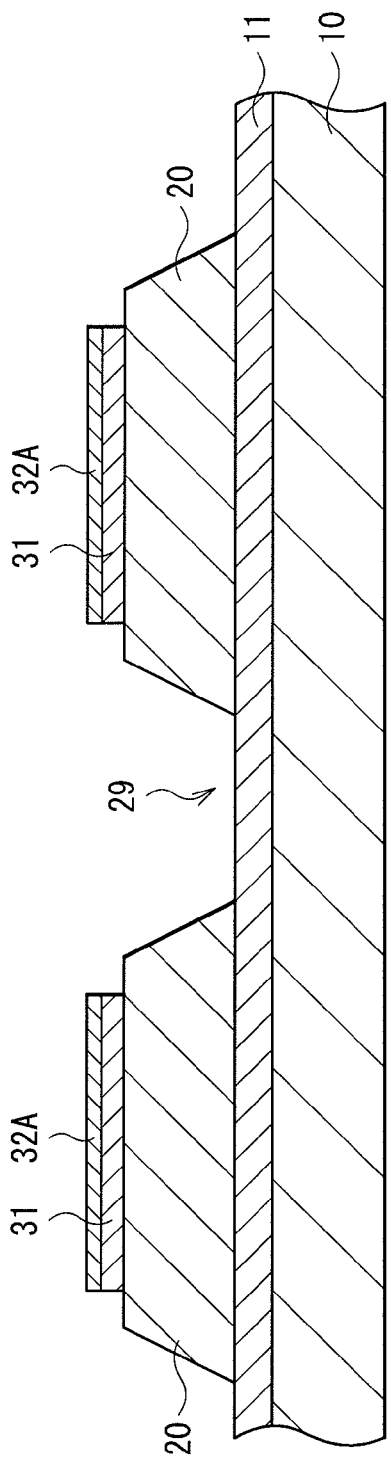
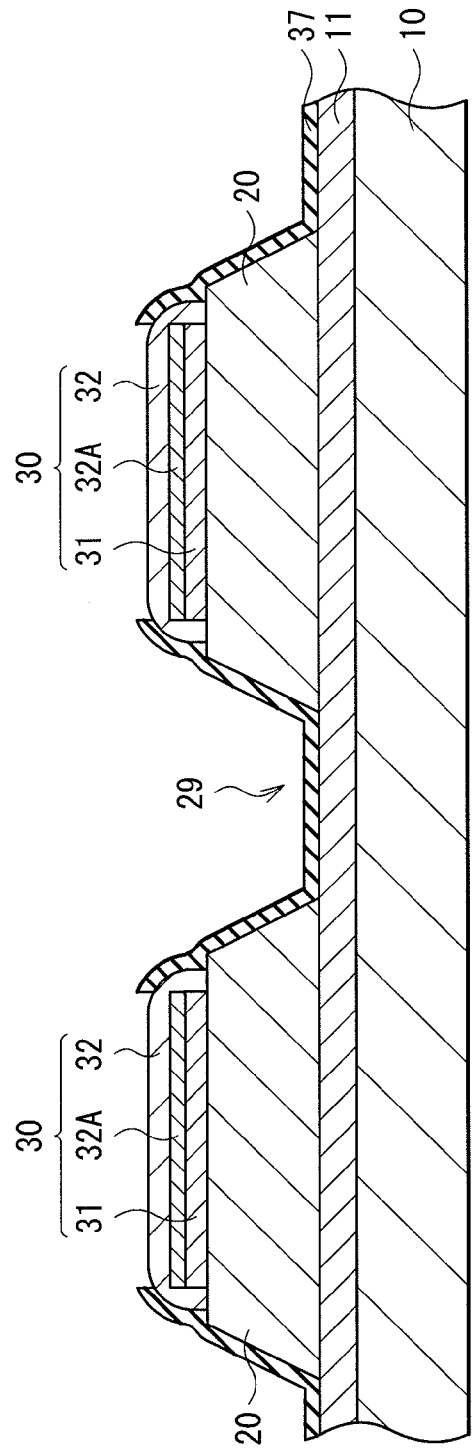
FIG. 3A
FIG. 3B

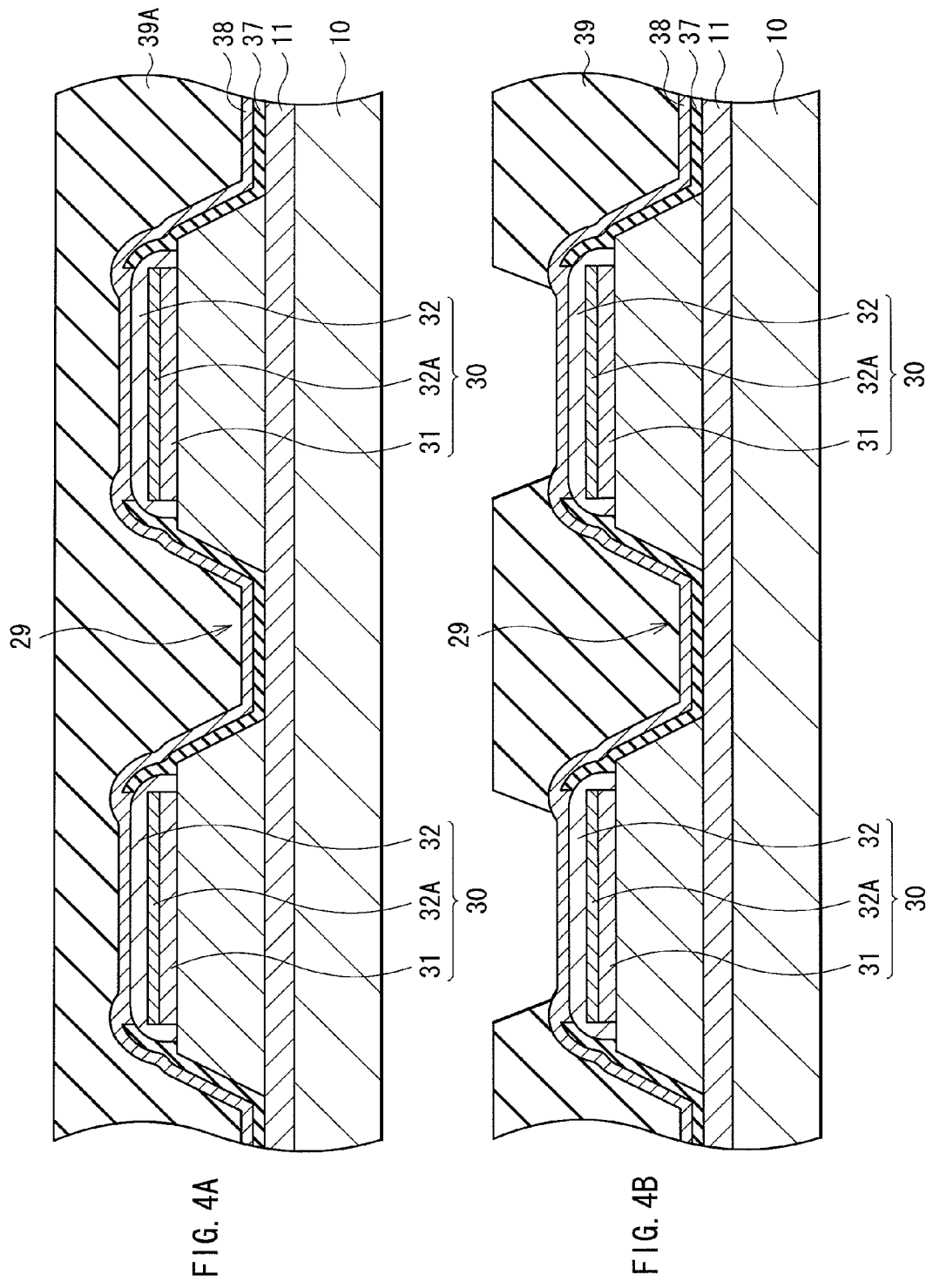

METHOD OF MANUFACTURING SEMICONDUCTOR DEVICE

BACKGROUND OF THE INVENTION

1. Field of the Invention

The present invention relates to a method of manufacturing a semiconductor device including a semiconductor layer made of gallium nitride (GaN).

2. Description of the Related Art

Nitride semiconductor such as gallium nitride (GaN) is applied in practice to a semiconductor light emitting device such as a light emitting diode (LED) and a semiconductor device such as a high-speed transistor capable of operating at high temperature.

At the time of manufacturing such a semiconductor device using the nitride semiconductor, a nitride semiconductor layer is grown to a predetermined thickness on a base-material substrate such as a sapphire substrate and, after that, the interface between the nitride semiconductor layer and the base-material substrate is peeled off, thereby obtaining a nitride semiconductor substrate. For example, the nitride semiconductor layer and the base-material substrate are separated by applying a laser beam having predetermined strength to the interface between the nitride semiconductor layer and the base-material substrate to locally heat and sublimate the laser beam applied part. By using the sublimation effect of such laser beam application, a semiconductor device is efficiently manufactured.

At the time of separation between the nitride semiconductor layer and the base-material substrate by the laser beam, during the process, only the part irradiated with the laser beam therebetween is separated, and the other part of them remains joined. Consequently, the possibility of occurrence of stress concentration in the joined part therebetween and occurrence of a crack in the surface of the nitride semiconductor layer is high.

A surface layer in which a crack occurs is called a damaged layer. The existence of the damaged layer causes deterioration in the physical strength and characteristics and may also cause contamination and adhesion of impurity during manufacturing process. In the case of manufacturing a semiconductor light emitting device, an electrode has to be attached to a nitride semiconductor layer. In the case where the surface layer of the nitride semiconductor layer is a damaged layer, contact resistance of the electrode tends to increase. Further, in the case of dry-etching the damaged layer on the surface in order to process the electrode, a shortcoming occurs such that a micro pillar structure called a pillar is generated.

To address the shortcoming, the applicant of the present invention developed a technique of removing a damaged layer by performing CMP (Chemical Mechanical Processing) after growing the nitride semiconductor layer as disclosed in, for example, Japanese Unexamined Patent Application Publication No. 2006-86388.

SUMMARY OF THE INVENTION

In the case where the nitride semiconductor layer is a GaN layer, when CMP is performed, a higher polishing rate is obtained on a −c plane than on a +c plane. Consequently, a polish-easy face in the GaN layer is the −c face. However, when the CMP is performed on the −c face of the GaN layer, due to the influence of the high polishing rate, it is difficult to reliably stop the CMP in a predetermined position. It is therefore difficult to obtain a GaN layer having a predetermined thickness.

It is therefore desirable to provide a method of manufacturing a semiconductor device to efficiently manufacture a semiconductor device including a nitride semiconductor layer having high-precision thickness.

A method of manufacturing a semiconductor device according to an embodiment of the invention includes steps of: forming a GaN layer whose main face is a +c face on a substrate; forming a trench by selectively etching down a partial region in the +c face of the GaN layer; forming a metal layer so as to bury the trench; and separating the substrate and the GaN layer, after that, polishing a −c face of the GaN layer until the metal layer is exposed, and removing a part in a thickness direction of the GaN layer. The crystal structure of the GaN layer as III-V group compound semiconductor is the wurtzite structure or the zinc blende structure. When the crystal structure is cleaved in a plane orthogonal to the c axis, the face (+c face) on the +c axis side is a crystal face in which gallium (Ga) atoms are arranged, and the face (−c face) on the −c axis side is a crystal face in which nitrogen (N) atoms are arranged.

In the method of manufacturing a semiconductor device of an embodiment of the invention, a metal layer is formed so as to bury trenches in the +c face of the GaN layer. After that, the −c face of the GaN layer is entirely polished, and a part in the thickness direction of the layer is removed. By the operation, at the time point the metal layer filled at the bottom of the trenches is exposed, the polishing rate decreases largely, so that it is easier to stop the polishing process without progressing the process excessively. Alternatively, the polishing process may be performed while detecting a change in electric resistance and stopped when a sharp change in the electric resistance occurs when the metal layer is exposed. In any case, the GaN layer having a thickness according to the depth of the trench remains.

According to the method of manufacturing a semiconductor device of an embodiment of the invention, after forming the metal layer so as to bury the trenches in the +c face of the GaN layer, polishing on the −c face on the side opposite to the +c face in the GaN layer is progressed. Consequently, at the time point when the metal layer is exposed, the polishing is stopped promptly. As a result, the GaN layer having a high-precision thickness is easily and efficiently fabricated.

Other and further objects, features and advantages of the invention will appear more fully from the following description.

BRIEF DESCRIPTION OF THE DRAWINGS

FIGS. 2A and 2B are cross sections illustrating a process in a method of manufacturing the light emitting diode shown in FIG. 1.

FIGS. 3A and 3B are cross sections illustrating a process subsequent to FIGS. 2A and 2B.

FIGS. 4A and 4B are cross sections illustrating a process subsequent to FIGS. 3A and 3B.

DETAILED DESCRIPTION OF THE PREFERRED EMBODIMENTS

An embodiment of the present invention will be described in detail below with reference to the drawings.

Configuration of Light Emitting Diode

Figure 1:
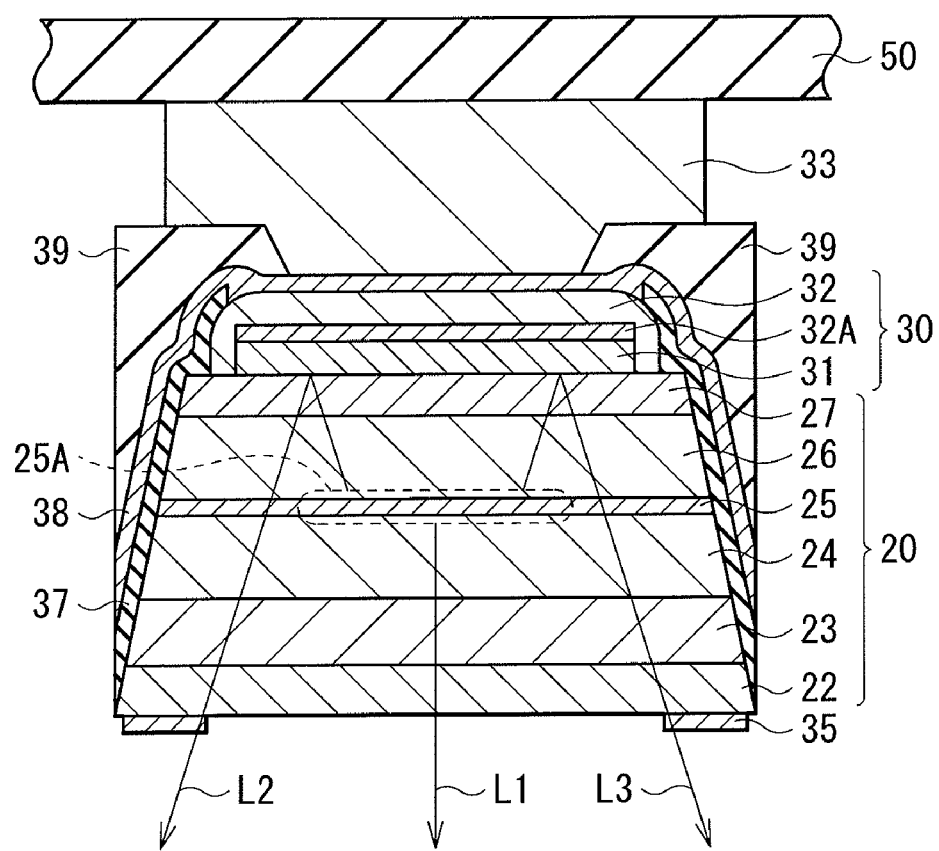
FIG. 1 is a cross section of a light emitting diode as an embodiment of the present invention.

FIG. 1 illustrates a sectional configuration of a light emitting diode (LED) as an embodiment of the present invention. FIG. 1 schematically illustrates the configurations whose dimensions and shapes are different from actual ones.

The light emitting diode has a semiconductor layer 20 including a nitride III-V group compound semiconductor, a p-side electrode 30, and an n-side electrode 35. The semiconductor layer 20 is a stacked body obtained by stacking a GaN layer 22, an n-type contact layer 23, an n-type cladding layer 24, an active layer 25, a p-type cladding layer 26, and a p-type contact layer 27 in this order. The p-side electrode 30 is provided on the surface of the p-type contact layer 27, and the n-side electrode 35 is provided on the surface of the GaN layer 22. The p-side electrode 30 is partly connected to a conductive connection layer 33. The connection layer 33 is a path for supplying current from an external power source to the p-side electrode 30. The connection layer 33 is adhered to a supporting substrate 50 with an adhesive layer 41 in between (not shown here). The light emitting diode is a semiconductor light emitting device of a type (so-called bottom emission type) that light from the active layer 25 is emitted via an n-type semiconductor layer including the n-type contact layer 23 and the n-type cladding layer 24.

In the embodiment, the nitride III-V group compound semiconductor is a nitride gallium compound containing gallium (Ga) and nitrogen (N) and is, for example, GaN, AlGaN (aluminum gallium nitride), AlGaInN (aluminum gallium indium nitride), and the like. As necessary, they contain n-type impurity made of IV-group and VI-group elements such as Si (silicon), Ge (germanium), O (oxygen), and Se (selenium), or p-type impurity made of II-group and IV-group elements such as Mg (magnesium), Zn (zinc), and C (carbon).

The GaN layer 22 is made of, for example, undoped GaN having a thickness of 0.5 μm and is formed by being grown with the use of the lateral crystal growth technique such as ELO (Epitaxial Lateral Overgrowth) technique on the c-face of sapphire. The n-type contact layer 23 is made of, for example, n-type GaN having a thickness of 4.0 μm, and the n-type cladding layer 24 is made of, for example, n-type AlGaN having a thickness of 1.0 μm.

The active layer 25 has a multiquantum well structure obtained by, for example, stacking three sets each made of an undoped $In_xGa_{1-x}N$ well layer ($0<x<1$) having a thickness of 3.5 nm and an undoped $In_yGa_{1-y}N$ barrier layer ($0<y<1$) having a thickness of 7.0 nm. The active layer 25 has a light emission region 25A which emits photons by recombination of injected electrons and holes in a center region in the plane direction. The p-type cladding layer 26 is made of, for example, p-type AlGaN having a thickness of 0.5 μm. The p-type contact layer 27 is made of, for example, p-type GaN having a thickness of 0.1 μm and having p-type impurity concentration higher than that of the p-type cladding layer 26.

A light reflection layer 31 is provided in a part of the top face of the p-type contact layer 27. The light reflection layer 31 is completely covered with a protection layer 32 as a plating film formed by nonelectrolytic plating. The protection layer 32 is made of, for example, an alloy containing at least one of, or two or more of nickel (Ni), copper (Cu), palladium (Pd), gold (Au), and tin (Sn).

Between the p-type contact layer 27 and the light reflection layer 31, for example, a metal layer made of a transition metal such as palladium (Pd), nickel (Ni), platinum (Pt), and rhodium (Rh) or a material obtained by adding silver (Ag) to the transition metal may be inserted. By providing the metal layer, improvement of mechanical adhesion between the p-type contact layer 27 and the light reflection layer 31 and improvement of electric contact, and the like are expected.

The light reflection layer 31 is made of a substance having metallic property, for example, silver (Ag) or silver alloy and has a thickness of, for example, 30 nm to 200 nm both inclusive. An example of the silver alloy is an alloy obtained by adding at least one substance selected from platinum (Pt), palladium (Pd), gold (Au), copper (Cu), indium (In), and gallium (Ga) to silver. More concretely, the light reflection layer 31 is made of a so-called APC alloy containing 98% of silver, 1% of palladium, and 1% of copper.

Fine silver and silver alloy have extremely high reflectance. By the material, the light reflection layer 31 displays the function of reflecting, toward the GaN layer 22, light which travels toward the side opposite to the GaN layer 22 as an emission window in light emitted from the light emission region 25A in the active layer 25. The light reflection layer 31 constructs, together with a metal layer 32A (which will be described later) and the protection layer 32, the p-side electrode 30 and is electrically connected to the connection layer 33. Consequently, the light reflection layer 31 is expected to have high electric contact to the p-type contact layer 27.

The metal layer 32A is provided on the top face of the light reflection layer 31. The metal layer 32A functions as a plating underlayer (plating seed layer) at the time of forming the protection layer 32 by the nonelectrolytic plating. The material of the metal layer 32A is, for example, nickel or nickel alloy.

A metal layer 38 is formed so as to cover the semiconductor layer 20 and the p-side electrode 30. An insulating layer 37 is provided between the metal layer 38 and an end face of the semiconductor layer 20, and the metal layer 38 is in contact only with the protection layer 32 of the p-side electrode 30.

Method of Manufacturing Light Emitting Diode

Next, an example of a method of manufacturing a light emitting diode having such a configuration will be described in detail with reference to FIGS. 2A and 2B to FIG. 8. Each of FIGS. 2A and 2B to FIG. 8 illustrates a sectional configuration of a light emitting diode in a manufacturing process. A case of forming a plurality of light emitting diodes in a lump will be described.

First, as illustrated in FIG. 2A, for example, sapphire whose main surface is the c face (plane direction {0001}) is prepared as a substrate 10, and a semiconductor film 20A made of nitride III-V group compound semiconductor such as GaN is formed on the entire c-face by, for example, MOCVD (Metal Organic Chemical Vapor Deposition) with a buffer layer 11 inbetween. The buffer layer 11 is also formed by low-temperature growth on the c face of sapphire by the MOCVD and is formed of, for example, undoped GaN having a thickness of 30 nm. As the material of the GaN compound semiconductor, for example, trimethyl aluminum (TMA), trimethyl gallium (TMG), trimethyl indium (TMIn), or ammonia ($NH_3$) is used. As the material of donor impurity, for example, silane ($SiH_4$) is used. As the material of acceptor impurity, for example, bis-methylcyclopentadienyl magnesium (($CH_3C_5H_4)_2Mg$) or bis-cyclopentadienyl magnesium (($C_5H_5)_2Mg$) is used.

Specifically, first, the surface (c-face) of the substrate 10 is cleaned by, for example, thermal cleaning. Subsequently, the buffer layer 11 is low-temperature grown on the cleaned substrate 10 by, for example, MOCVD at a temperature of, for example, about 500° C. After that, the GaN layer 22 is grown, for example, at a growth temperature of 1,000° C. by, for example, the lateral crystal growth technique such as ELO.

Next, on the GaN layer 22, for example, by MOCVD, the n-type contact layer 23, the n-type cladding layer 24, the active layer 25, the p-type cladding layer 26, and the p-type contact layer 27 are sequentially grown. The growth temperature for the n-type contact layer 23, the n-type cladding layer 24, the p-type cladding layer 26, and the p-type contact layer 27 as layers containing no indium (In) is, for example, about 1,000° C., and the growth temperature of the active layer 25 as a layer containing indium (In) is, for example, 700° C. to 800° C. both inclusive. After crystal-growing the semiconductor layer 20 in such a manner, for example, by performing heating for tens of minutes at a temperature of 600° C. to 700° C. both inclusive, the acceptor impurity in the p-type cladding layer 26 and the p-type contact layer 27 is achieved.

Next, a resist pattern 40 in a predetermined shape is formed on the p-type contact layer 27. After that, as illustrated in FIG. 2B, an exposed part in the semiconductor film 20A is etched down to the buffer layer 11 by, for example, RIE (Reactive Ion Etching) using chlorine gas with the resist pattern 40 as a mask, thereby forming a plurality of semiconductor layers 20 separated from each other by trenches 29.

Next, as illustrated in FIG. 3A, after removal of the resist pattern 40, the light reflection layer 31 and the metal layer 32A are stacked in order by, for example, sputtering on the p-type contact layer 27.

After formation of the metal layer 32A, as illustrated in FIG. 3B, by nonelectrolytic plating using the metal layer 32A as a plating underlayer, the protection layer 32 is formed so as to completely cover the light reflection layer 31. By the operation, the p-side electrode 30 is obtained. In this case, at least the top face (the face on the side opposite to the p-type cladding layer 26) of the p-type contact layer 27, the end face of the light reflection layer 31, and the surface of the metal layer 32A are immersed in a plating bath. By the immersion, not only the surface of the metal layer 32A but also the surface of the p-type contact layer 27 in the peripheral region of the metal layer 32A are plated. That is, plating develops using at least one of the metal layer 32A, the light reflection layer 31, and the p-type contact layer 27 as a base point. As a result, the precise and firm protection layer 32 covering the light reflection layer 31 and the periphery of the metal layer 32A is formed. Preferably, by changing at least one of thickness and the composition of the material of the metal layer 32A, the surface potentials of the metal layer 32A and the light reflection layer 31 and the potential of the p-type cladding layer 26 which changes according to the surface potentials are adjusted. It controls the electrochemical reactivity in the plating bath to adjust the formation region (spread) of the protection layer 32 as a plating film. In particular, the potential of the p-type cladding layer 26 converges to the natural potential in the plating bath with distance from the metal layer 32A in accordance with the magnitude of the internal resistance of the p-type cladding layer 26 itself. By controlling the potential gradient, the formation region (spread) of the protection layer 32 is adjusted. Although the example of providing the metal layer 32A so as to cover the entire top face of the light reflection layer 31 is illustrated in FIGS. 3A and 3B, the metal layer 32A may be formed so as to cover only a part of the top face of the light reflection layer 31. Since the electrochemical reactivity is also controlled by changing the surface area of the metal layer 32A as described above, the protection layer 32 having a desired planar shape and sectional shape is obtained.

After that, the insulating layer 37 is selectively formed so as to cover all of the exposed part in the semiconductor layer 20 and the buffer layer 11 and expose at least a part of the p-side electrode 30. In this case, by applying a resist so as to cover the whole, an insulating film is formed. After that, heat treatment (baking) is performed as necessary and, further, the insulating film is selectively removed so as to expose a part of the top face of the protection layer 32 by using the photolithography technique, thereby obtaining the insulating layer 37.

As illustrated in FIG. 4A, the metal layer 38 made of, for example, copper (Cu) is formed so as to cover the entire device. For the metal layer 38, except for copper, titanium (Ti), aluminum (Al), nickel (Ni), gold (Au), chromium (Cr), or the like may be used.

Further, by applying a resist or the like so as to cover the entire device, an insulating film 39A is formed. The insulating film 39A may be formed with a thickness so that the trench 29 separating the neighboring semiconductor layers 20 is completely filled and the top face of the insulating film 39A becomes flat. Subsequently, the heat treatment (baking) is performed as necessary and, as illustrated in FIG. 4B, the insulating film 39A is selectively removed so as to expose a part of the top face of the protection layer 32 by using the photolithography technique, thereby forming the insulating layer 39.

Figure 5:
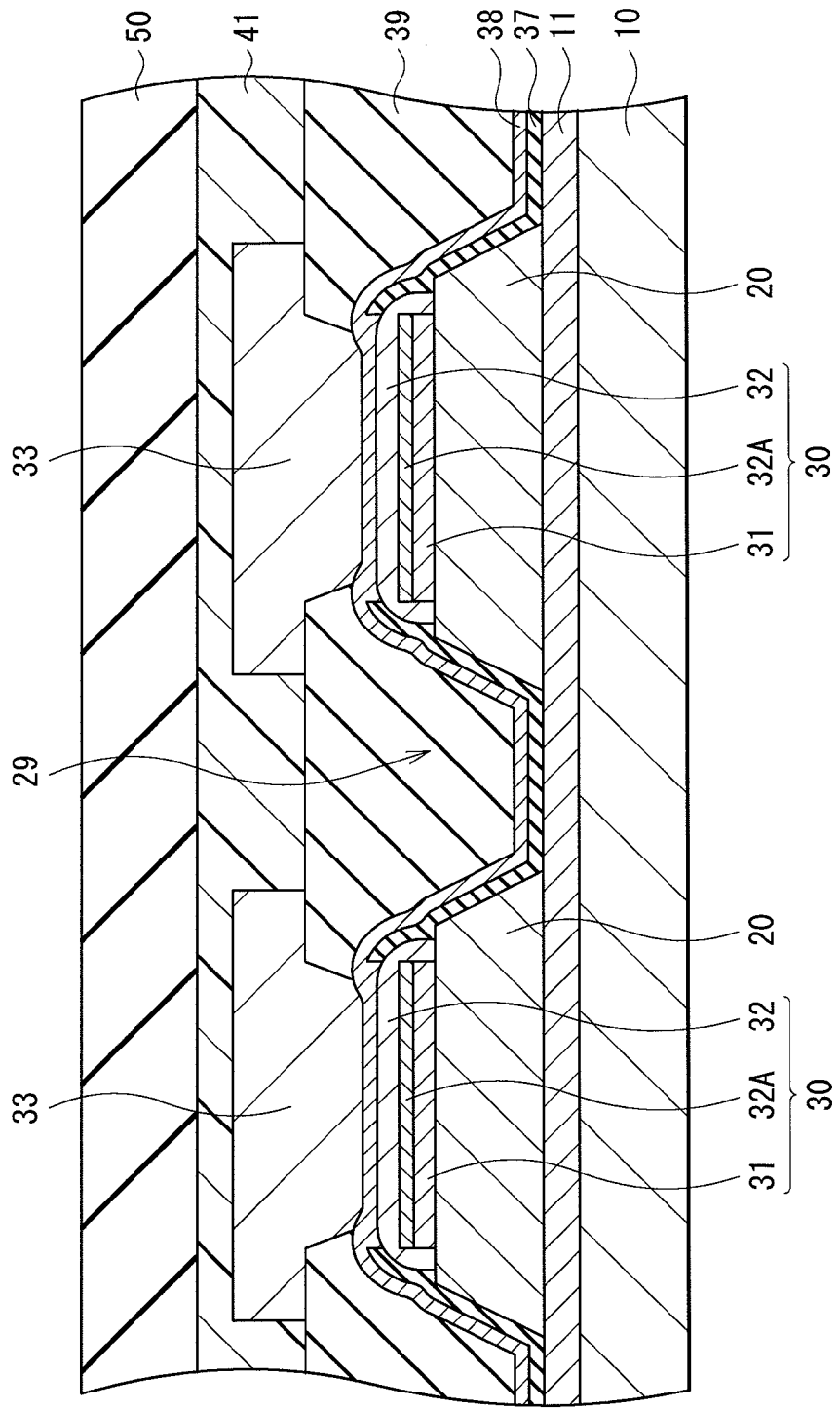
FIG. 5 is a cross section illustrating a process subsequent to FIGS. 4A and 4B.

Subsequently, a plating film made of copper (Cu) or the like is formed by electroplating or the like and patterned, thereby forming the connection layer 33 connected to the p-side electrode 30 as illustrated in FIG. 5. After that, the adhesive layer 41 is formed so as to cover the connection layer 33 and bury the periphery of the connection layer 33, and the supporting substrate 50 made of sapphire or the like is joined to the connection layer 33 with the adhesive layer 41 in between.

After that, for example, an excimer laser is applied to the entire back face of the substrate 10 to perform laser ablation in the interface between the substrate 10 and the buffer layer 11, thereby separating the substrate 10 and the buffer layer 11. The laser ablation is a phenomenon such that a part of the buffer layer 11 irradiated with the laser beam is locally heated and sublimated and the substrate 10 and the buffer layer 11 are separated from each other. In this case, a damaged layer is generated on the surface of the separated buffer layer 11.

Figure 6:
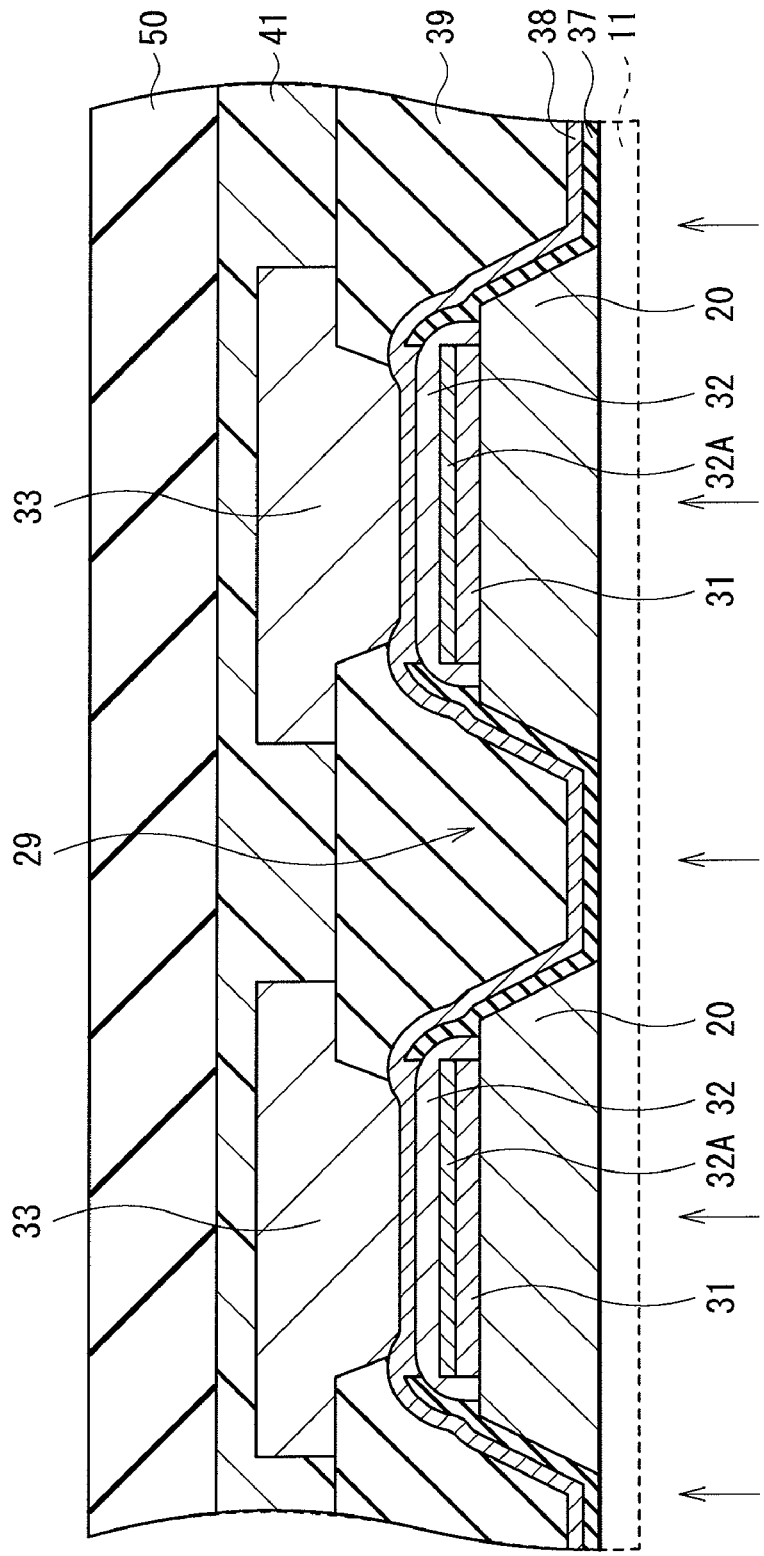
FIG. 6 is a cross section illustrating a process subsequent to FIG. 5.

Therefore, as illustrated in FIG. 6, by polishing the −c face of the buffer layer 11 by CMP (Chemical Mechanical Polishing), the damaged layer is removed reliably. When the CMP is continued in the layer stack direction, all of the buffer layer 11 is removed, and the bottom face of the semiconductor layer 20, and the insulating layer 37 positioned at the bottom of the trench 29 appear in the polished face.

Figure 7:
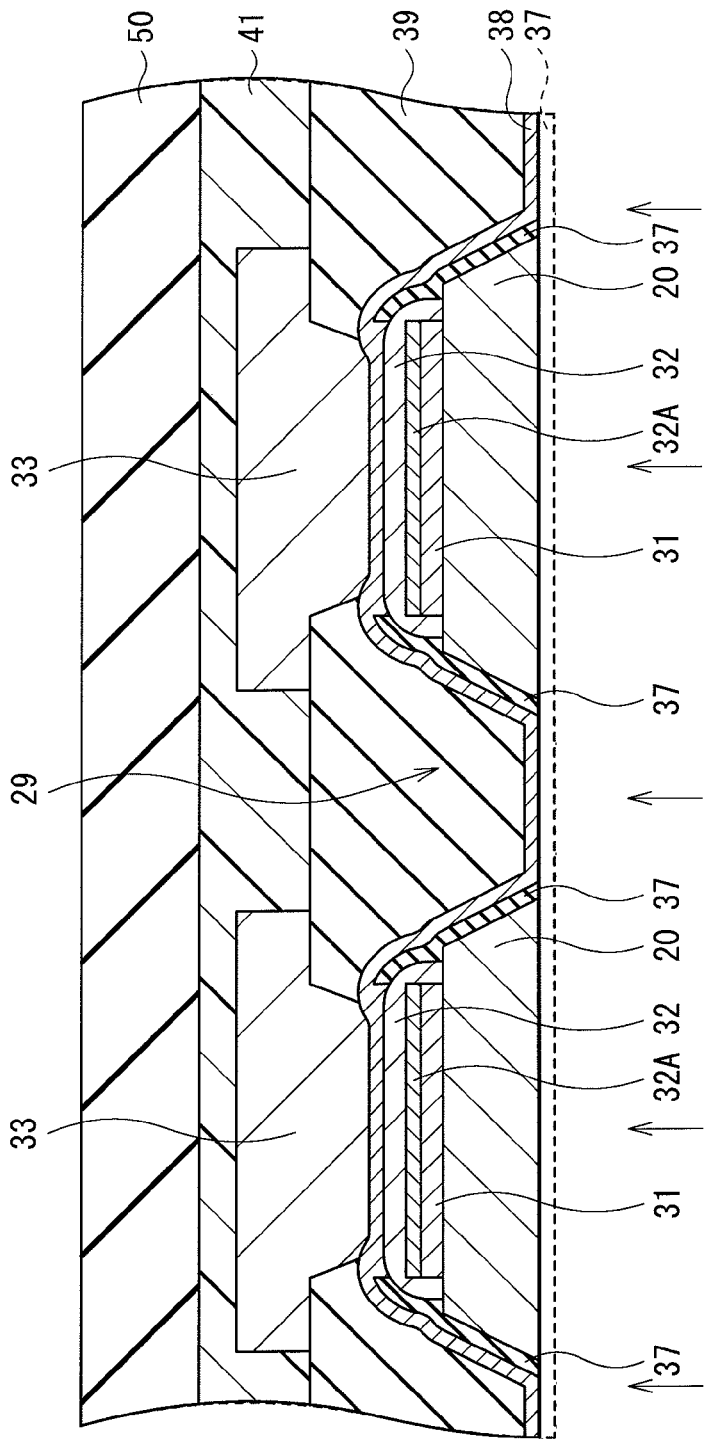
FIG. 7 is a cross section illustrating a process subsequent to FIG. 6.

When the CMP is further continued, the insulating layer 37 burying the bottom face of the trench 29 is removed, and the polished face reaches the metal layer 38 as illustrated in FIG. 7. When the metal layer 38 is exposed, the polishing rate largely decreases as compared with that before the metal layer 38 is exposed. Therefore, by detecting the change, the polishing is stopped accurately in a predetermined position.

The CMP uses, concretely, as a polishing solution (CMP slurry), a dispersed member obtained by making polishing agent particles of $SiO_2$ (colloidal silica), $CeO_2$, $Al_2O_3$, $MnO_2$, or the like dispersed in water containing an agent of electrolyte such as potassium hydroxide (KOH), oxidant such as hydrogen peroxide, inorganic acid such as nitric acid, hydrofluoric acid, or buffered hydrofluoric acid, organic acid such as carboxylic acid, inorganic or organic alkaline agent, organic dispersant, or surface acting agent, or the like. Usually, polishing is carried out by using a polishing pad made of polyurethane or the like. By such CMP, different from normal polishing, the surface is polished without forming an affected layer in a processed face by the cooperation of the chemical and mechanical actions. Moreover, the polishing agent particles used in the CMP make the temperature rise locally in the interface in contact with the polishing face to promote a chemical reaction, and make products of the reaction absorbed by the surface of the polishing agent particles to promote the polishing. In normal polishing, there is the possibility that a microcrack layer is formed by the mechanical action of the polishing agent particles and a damaged part is formed. In contrast, by using the CMP, polishing is carried out without generating a microcrack layer. It is therefore advantageous to suppress increase in contact resistance in the polished face in the case of forming an electrode or the like in a later process.

Figure 8:
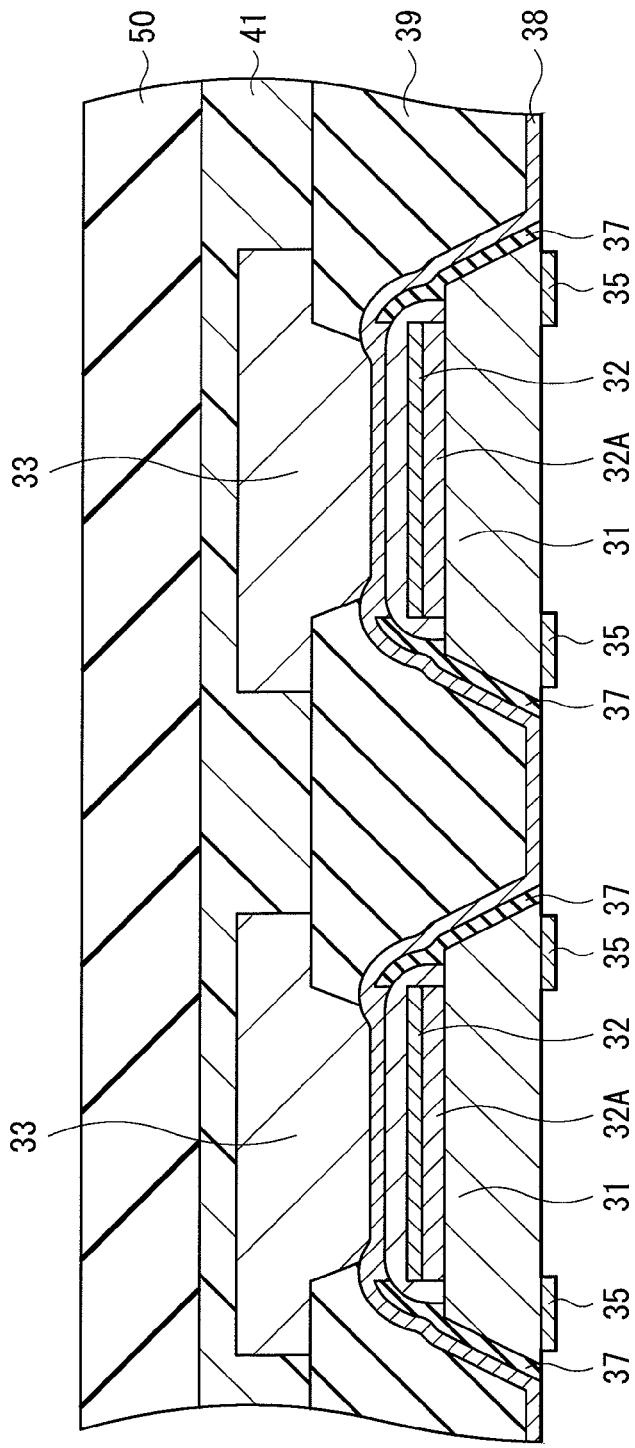
FIG. 8 is a cross section illustrating a process subsequent to FIG. 7.

Further, a titanium (Ti) layer, a platinum (Pt) layer, and a gold (Au) layer are sequentially stacked by evaporation or the like so as to cover the face on the side opposite to the p-side electrode 30 in the semiconductor layer 20 exposed by the CMP and patterned in a predetermined shape, thereby forming the n-side electrode 35 (refer to FIG. 8).

Finally, by performing a predetermined process such as dicing of the device into the semiconductor layers 20, the light emitting diode of the embodiment is manufactured.

In the light emitting diode manufactured as described above, when current is supplied to the p-side electrode 30 and the n-side electrode 35, the current is injected to the light emission region 25A in the active layer 25 and, by recombination of electrons and holes, light is generated. Light L1 travelling directly to the GaN layer 22 as the emission window in the light generated in the light emission region 25A passes through the substrate 10 to the outside, and light L2 and L3 travelling to the side opposite to the GaN layer 22 is reflected toward the GaN layer 22 by the light reflection layer 31 and, after that, passes through the semiconductor layer 20 and emits to the outside (refer to FIG. 1).

Since the light L2 and light L3 are reflected by the light reflection layer 31 constructed by containing silver (Ag) having extremely high reflectance, the reflectance and the light extraction efficiency becomes higher than that in the case where the light reflection layer 31 does not contain silver (Ag).

Operation and Effect of Embodiment

As described above, in the embodiment, a plurality of semiconductor layers 20 made of GaN or the like and separated by the trenches 29 are formed on the buffer layer 11 and, after that, the metal layer 38 is formed so as to cover the bottom faces of the trenches 29 and in contact with the +c face of the semiconductor layer 20. After that, CMP is performed from the side of the −c face of the semiconductor layer 20 to eliminate all of the buffer layer 11 and a part in the thickness direction of the semiconductor layer 20. By the CMP, the polishing rate largely drops at the time point when the metal layer 38 formed at the bottom of the trench 29 is exposed on the polish face, so that it becomes easier to stop the polishing in the predetermined position without performing the CMP excessively.

The phenomenon will be considered as follows. First, GaN as the material of the semiconductor layer 20 has a crystal field by internal polarization or the like. Consequently, at the stage before the metal layer 38 is exposed on the polished face, the face (+c face) on the side in contact with the p-side electrode 30 in the semiconductor layer 20 and the p-side electrode 30 and the metal layer 38 which are conducted with the face have a relatively higher potential. On the other hand, the face on the side opposite to the p-side electrode 30 (the face to be polished, that is, the −c face) in the semiconductor layer 20 has a relatively lower potential. In the circumstances, the difference occurs in the surface potential between the +c face and the −c face, so that corrosion in the −c face by the polishing solution used for the CMP tends to progress. However, when the CMP progresses and the metal layer 38 is exposed on the polished face, by the contact between the polishing pad of a CMP processing apparatus and the metal layer 38, the potential of the polished face and that of the metal layer 38 become equal to each other. That is, the surface potential of the +c face and that of the −c face become equal to each other, and corrosion in the −c face caused by the polishing solution is suppressed. As a result, the polishing rate largely decreases.

In the embodiment, the polishing process is performed while detecting a change in the electric resistance. At the time point a sharp change in the electric resistance occurs when the metal layer 38 is exposed on the polished face, the polishing process is stopped reliably. In any case, the semiconductor layer 20 having a thickness according to the depth of the trench 29 remains. That is, after forming the metal layer 38 so as to bury the trench 29 formed by etching down the +c face of the semiconductor film 20A, polishing on the −c face in the semiconductor layer 20 is progressed, so that the polishing is stopped promptly at the time point the metal layer 38 is exposed. As a result, the semiconductor layer 20 having a high-precision thickness is easily and efficiently manufactured, and a high-reliable light emitting diode displaying desired performances is realized.

In the embodiment, at the time of forming the trench 29, a partial region in the semiconductor film 20A is etched down to the buffer layer 11. Alternatively, the partial region may be etched to some midpoint in the thickness direction and a part of the semiconductor film 20A may be left. In this case as well, by covering the bottom face of the trench 29 and forming the metal layer 38 so as to be in contact with the +c face of the semiconductor film 20A, polishing from the +c face side of the semiconductor film 20A is accurately stopped at the time point the metal layer 38 is exposed on the polished face. Simultaneously, the semiconductor film 20A is separated to the plurality of semiconductor layers 20.

Example

An example of the present invention will be described in detail.

As an example, according to the description of the foregoing embodiment, a light emitting diode of FIG. 1 was fabricated. First, sapphire whose main face is the c face was prepared as the substrate 10, and a film was grown on the c face at 500° C. by the MOCVD to form the buffer layer 11 of undoped GaN having a thickness of 30 nm. After that, the undoped GaN was grown on the buffer layer 11 at 1,000° C. by the ELO technique, thereby forming the GaN layer 22 having a thickness of 0.5 μm. Further, on the GaN layer 22, by MOCVD, the n-type contact layer 23, the n-type cladding layer 24, the active layer 25, the p-type cladding layer 26, and the p-type contact layer 27 were sequentially grown, thereby obtaining the semiconductor film 20A. In this case, the growth temperature for the n-type contact layer 23, the n-type cladding layer 24, the p-type cladding layer 26, and the p-type contact layer 27 was about 1,000° C., and the growth temperature for the active layer 25 was 720° C. for green and 780° C. for blue. The n-type contact layer 23 was made of n-type GaN having a thickness of 4.0 µm, and the n-type cladding layer 24 was made of n-type AlGaN having a thickness of 1.0 µm. The active layer 25 has a multiquantum well structure obtained by stacking three sets each made of an undoped $In_xGa_{1-x}N$ well layer (0<x<1) having a thickness of 3.5 nm and an undoped $In_yGa_{1-y}N$ barrier layer (0<y<1) having a thickness of 7.0 nm. The p-type cladding layer 26 was made of p-type AlGaN having a thickness of 0.5 µm. The p-type contact layer 27 was made of p-type GaN having a thickness of 0.1 µm and having p-type impurity concentration higher than that of the p-type cladding layer 26.

Next, after forming the p-side electrode 30 in the predetermined position, by selectively etching the semiconductor film 20A down to the GaN layer 22 by using RIE, a projection 28 and the trench 29 were formed. After that, the metal layer 38 was formed using copper so as to cover the entire device. The depth of the trench 29 was set to 2.1 µm. That is, the target value of the thickness of the semiconductor layer 20 was set to 2.1 µm.

Figure 9:
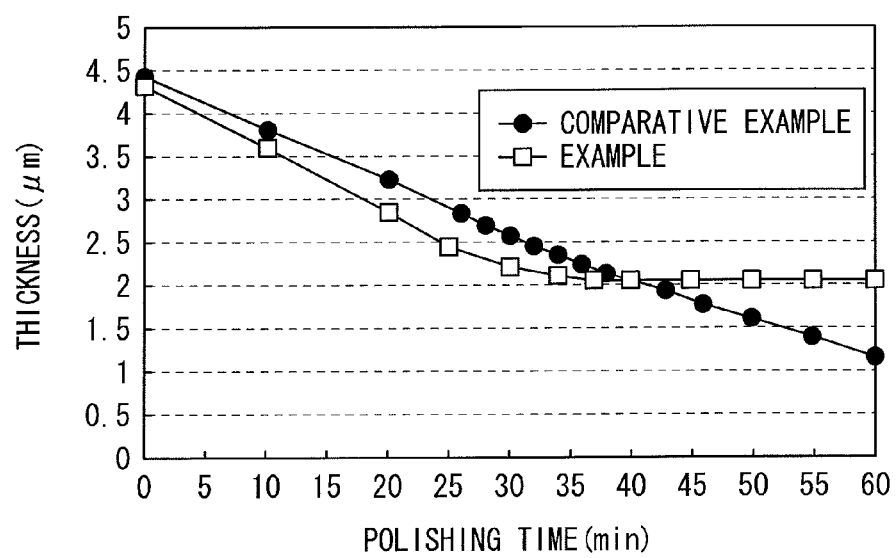
FIG. 9 is a characteristic diagram showing changes with time of a GaN layer at the time of polishing in the example of the present invention.

Subsequently, the substrate 10 was separated from the buffer layer 11, and the −c faces in the buffer layer 11 and the GaN layer were polished entirely. The relation between polishing time (lapse time) and changes in the film thickness was examined. FIG. 9 illustrates the result. In FIG. 9, the lateral axis denotes polishing time (minutes), and the vertical axis denotes thickness of the remained semiconductor layer 20 (semiconductor film 20A). A polishing solution containing potassium hydroxide (KOH) was used, and the polishing rate was 0.07 µm/min.

Comparative Example

A light emitting diode as a comparative example was fabricated in a manner similar to the above except that the projection 28 and the trench 29 were covered with, in place of the metal layer 38, a resin ("VPA100" made by Nippon Steel Chemical Co., Ltd) using, as main components, visphenol fluorene epoxy acrylate acid adduct and propylene glycol monomethyl ether acetate (PGMEA).

As illustrated in FIG. 9, in the example (the curve shown by blank square), the polishing rate decreased as the thickness of the semiconductor layer 20 became closer to 2.1 µm as the target value, and polishing hardly progressed at the time point the polishing rate reaches 2.1 µm (the time point the metal layer 38 burying the trench 29 is exposed). On the other hand, in the comparative example (the curve shown by the solid circles), although the polishing rate decreased slightly at the time point the thickness of the semiconductor layer 20 reached 2.1 µm as a target value, the polishing continued after that.

As described above, in the example, it was confirmed that the semiconductor layer (GaN layer) having a desired thickness is easily manufactured.

Although the present invention has been described by the foregoing embodiment, the invention is not limited to the modes described in the foregoing embodiment but may be variously modified. For example, in the foregoing embodiment, the light emitting diode was described as a semiconductor device. The semiconductor device of the present invention is a concept including other devices such as a transistor having a GaN layer.

The present application contains subject matter related to that disclosed in Japanese Priority Patent Application JP 2010-079571 filed in the Japanese Patent Office on Mar. 30, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, the method comprising steps of:
   forming a gallium nitride (GaN) layer whose main face is a +c face on a substrate;
   forming a trench by selectively etching down a partial region in the +c face of the GaN layer;
   forming a metal layer to bury the trench; and
   separating the substrate and the GaN layer, after that, polishing a −c face of the GaN layer until the metal layer is exposed, and removing a part in a thickness direction of the GaN layer.

2. The method of manufacturing a semiconductor device according to claim 1, wherein at a time when the metal layer is exposed, the polishing of the −c face of the GaN layer is stopped.

3. The method of manufacturing a semiconductor device according to claim 1, wherein a sapphire substrate whose main face is a +c face is used as the substrate, and
   the GaN layer is formed by being epitaxially grown on the +c face of the sapphire substrate.

4. The method of manufacturing a semiconductor device according to claim 1, wherein the −c face of the GaN layer is polished by chemical mechanical polishing using a polishing solution containing potassium hydroxide.

5. The method of manufacturing a semiconductor device according to claim 1, wherein the substrate and the GaN layer are separated from each other by laser ablation.

6. The method of manufacturing a semiconductor device according to claim 1, wherein the metal layer is formed of copper.

* * * * *